(12) United States Patent
Pandey

(10) Patent No.: US 11,782,351 B2
(45) Date of Patent: Oct. 10, 2023

(54) METROLOGY DEVICE AND DETECTION APPARATUS THEREFOR

(71) Applicant: ASML Netherlands B.V., Veldhoven (NL)

(72) Inventor: Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/636,830

(22) PCT Filed: Jul. 15, 2020

(86) PCT No.: PCT/EP2020/069935
§ 371 (c)(1),
(2) Date: Feb. 18, 2022

(87) PCT Pub. No.: WO2021/032369
PCT Pub. Date: Feb. 25, 2021

(65) Prior Publication Data
US 2022/0334497 A1  Oct. 20, 2022

(30) Foreign Application Priority Data
Aug. 22, 2019  (EP) .................................... 19192986

(51) Int. Cl.
*G03F 7/00* (2006.01)
*G03F 7/20* (2006.01)
(52) U.S. Cl.
CPC ........ *G03F 7/7085* (2013.01); *G03F 7/70275* (2013.01); *G03F 7/70625* (2013.01); *G03F 7/70641* (2013.01)

(58) Field of Classification Search
CPC ............... G03F 7/7085; G03F 7/70275; G03F 7/70625; G03F 7/70641; G03F 7/70633
See application file for complete search history.

(56) References Cited

U.S. PATENT DOCUMENTS 6,020,964 A    2/2000  Loopstra et al.
6,838,715 B1 *  1/2005  Bencuya ........... H01L 27/14627
                                         257/187
(Continued)

FOREIGN PATENT DOCUMENTS

EP    1 628 164 A2    2/2006
EP    3 410 211 A1   12/2018
(Continued)

OTHER PUBLICATIONS

International Search Report and Written Opinion of the International Searching Authority directed to related International Patent Application No. PCT/EP2020/069935, dated Oct. 20, 2020; 11 pages.
(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is a detection apparatus for a metrology device operable to measure a parameter of interest from scattered radiation having been scattered from a sample. The detection device comprises a detector comprising an array of pixels. The array of pixels comprises imaging pixels for detecting an image from which the parameter of interest is determined, and direction detecting pixels for detecting the angle of incidence of said scattered radiation on said detector.

15 Claims, 5 Drawing Sheets

(56) References Cited

U.S. PATENT DOCUMENTS

| | | |
|---|---|---|
| 6,952,253 B2 | 10/2005 | Lof et al. |
| 9,753,379 B2 * | 9/2017 | Singh .................... G01J 3/2823 |
| 10,451,559 B2 | 10/2019 | Van Voorst et al. |
| 10,816,909 B2 | 10/2020 | Tinnemans et al. |
| 2007/0296960 A1 | 12/2007 | Den Boef et al. |
| 2008/0198380 A1 | 8/2008 | Straaijer et al. |
| 2009/0168062 A1 | 7/2009 | Straaijer |
| 2010/0007863 A1 | 1/2010 | Jordanoska |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0073775 A1 | 3/2011 | Setija et al. |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0044470 A1 | 2/2012 | Smilde et al. |
| 2012/0044495 A1 | 2/2012 | Straaijer |
| 2013/0162996 A1 | 6/2013 | Straaijer et al. |
| 2013/0308142 A1 | 11/2013 | Straaijer |
| 2015/0054104 A1 * | 2/2015 | Black ................ H01L 27/14627 257/432 |
| 2016/0161863 A1 | 6/2016 | Den Boef et al. |
| 2016/0370717 A1 | 12/2016 | Den Boef et al. |
| 2017/0082932 A1 | 3/2017 | Fu et al. |
| 2017/0097575 A1 | 4/2017 | Pandey et al. |
| 2017/0322497 A1 | 11/2017 | Lin et al. |
| 2019/0107781 A1 | 4/2019 | Tinnemans et al. |

FOREIGN PATENT DOCUMENTS

| | | |
|---|---|---|
| EP | 3 480 554 A1 | 5/2019 |
| EP | 3 528 048 A1 | 8/2019 |
| EP | 3 531 191 A1 | 8/2019 |
| TW | 2019-25922 A | 7/2019 |
| TW | 2019-30861 A | 8/2019 |
| WO | WO 2011/012624 A1 | 2/2011 |
| WO | WO 2019/068459 A1 | 4/2019 |
| WO | WO 2019/166190 A1 | 9/2019 |
| WO | WO 2019/197117 A1 | 10/2019 |

OTHER PUBLICATIONS

Kobayashi et al., "A Low Noise and High Sensitivity Image Sensor with Imaging and Phase-Difference Detection AF in All Pixels," ITE Transactions on Media Technology and Applications, vol. 4, No. 2, Apr. 1, 2016; 4 pages.

Choi et al., "CMOS image sensor for extracting depth information using offset pixel aperture technique," Proc. SPIE, Novel Optical Systems Design and Optimization XX, vol. 10376, Aug. 24, 2017; 7 pages.

* cited by examiner

METROLOGY DEVICE AND DETECTION APPARATUS THEREFOR

CROSS REFERENCE TO RELATED APPLICATIONS

This application claims priority of EP application 19192986.8 which was filed on 2019 Aug. 22 and which is incorporated herein in its entirety by reference.

FIELD

The present invention relates to a metrology apparatus or an inspection apparatus for determining a characteristic of structures on a substrate. The present invention also relates to a detection apparatus for such a metrology device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

A metrology device may use computationally retrieved phase to apply aberration correction to an image captured by the metrology device. One method described, for the calculation of phase, uses multiple diverse images, such as multiple images of the same target under different focus conditions. This typically requires mechanical movement of the sample (e.g., target), and multiple images captures which has a high time cost. Also, it is assumed that moving the sample through focus is equivalent to moving the detector through focus. The validity of this assumption is questionable. Furthermore, the defocus range over which this assumption is valid may be too short to obtain sufficient information for a successful reconstruction.

SUMMARY

It is desirable to reduce acquisition time and increase throughput when performing a phase retrieval in a metrology application.

Embodiments of the invention are disclosed in the claims and in the detailed description.

In a first aspect of the invention there is provided a detection apparatus for a metrology device operable to measure a parameter of interest from scattered radiation having been scattered from a sample; the detection device comprising: a detector comprising an array of pixels, said array of pixels comprising imaging pixels for detecting an image from which the parameter of interest is determined, and direction detecting pixels for detecting the angle of incidence of said scattered radiation on said detector.

In a second aspect of the invention there is provided a metrology device comprising the detection apparatus of the first aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
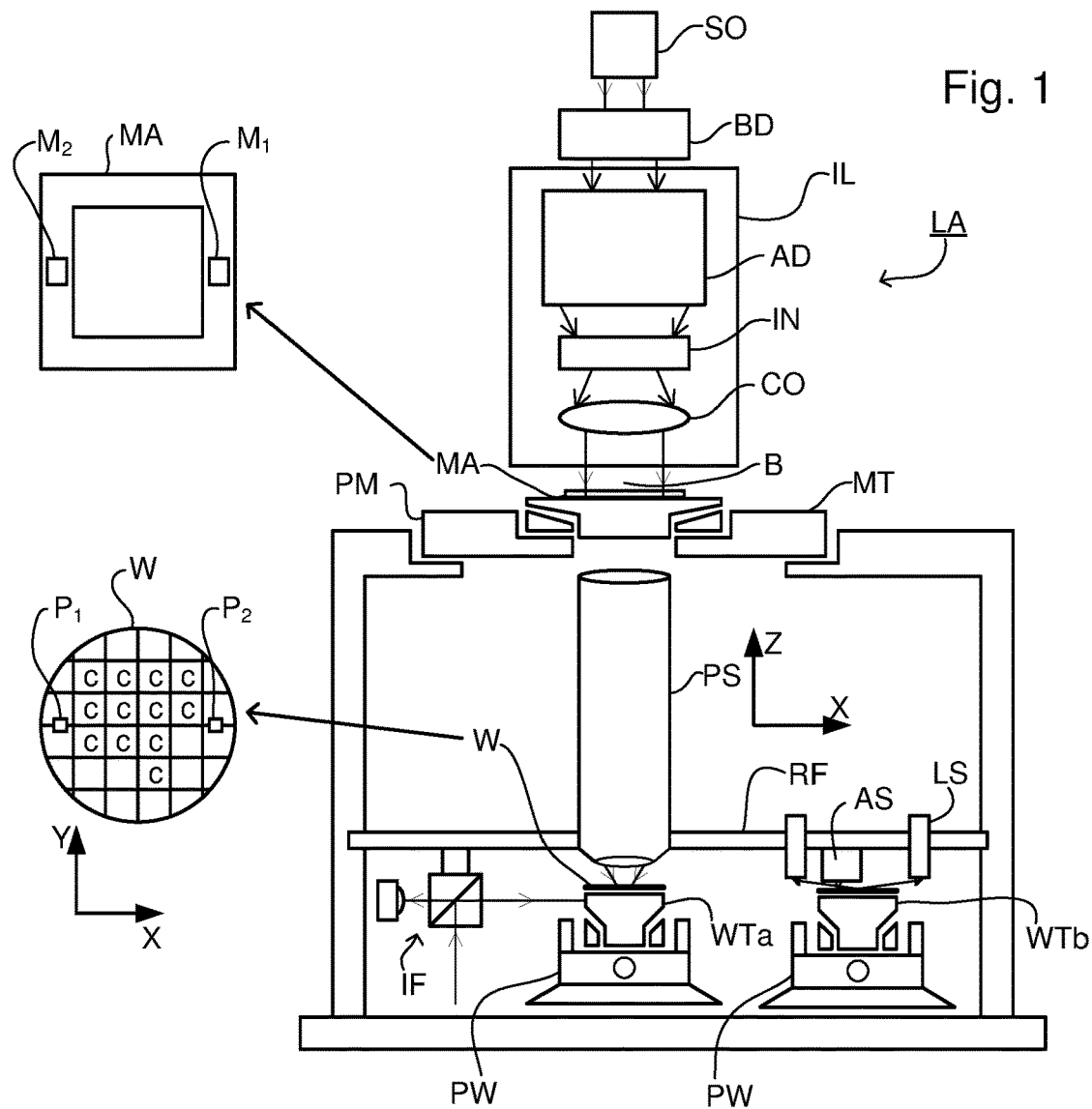
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
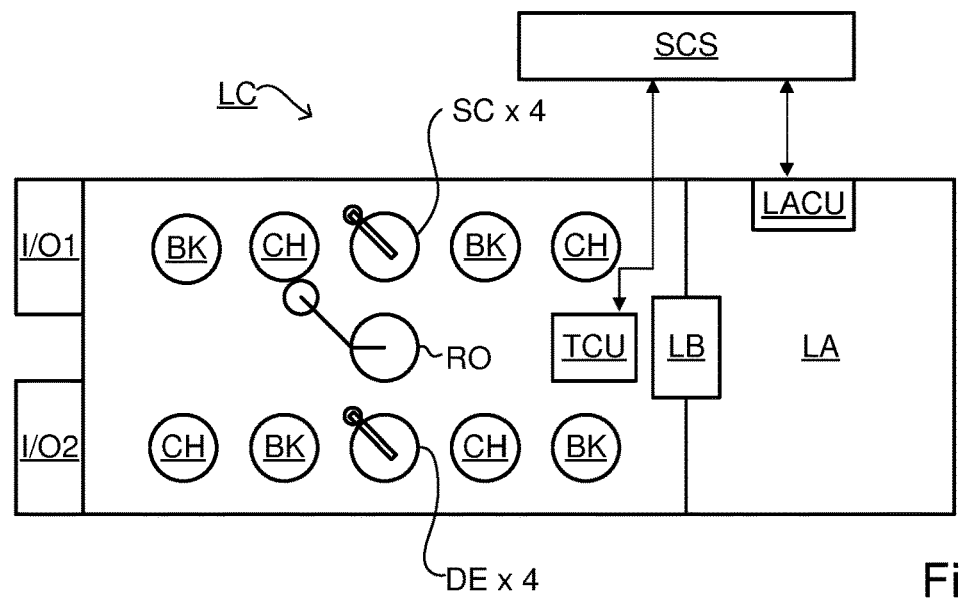
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
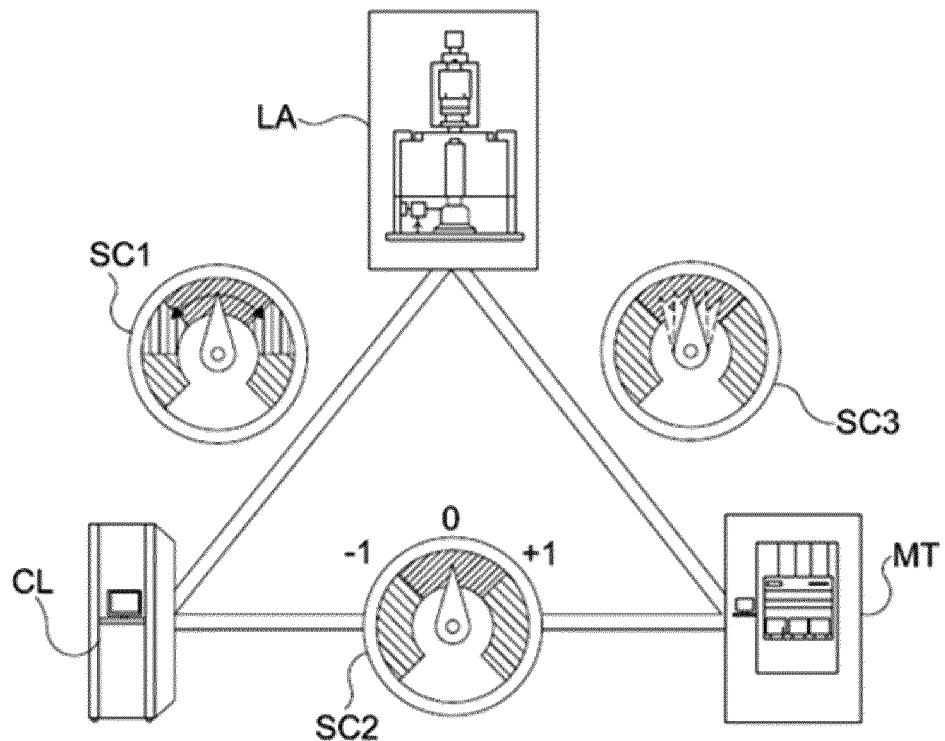
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
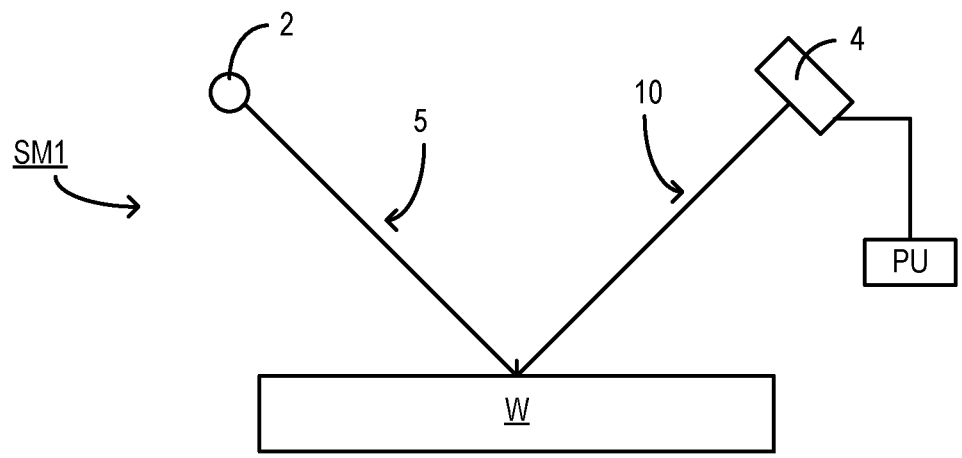
FIG. 4 is a schematic illustration of a scatterometry apparatus.
Figure 4:
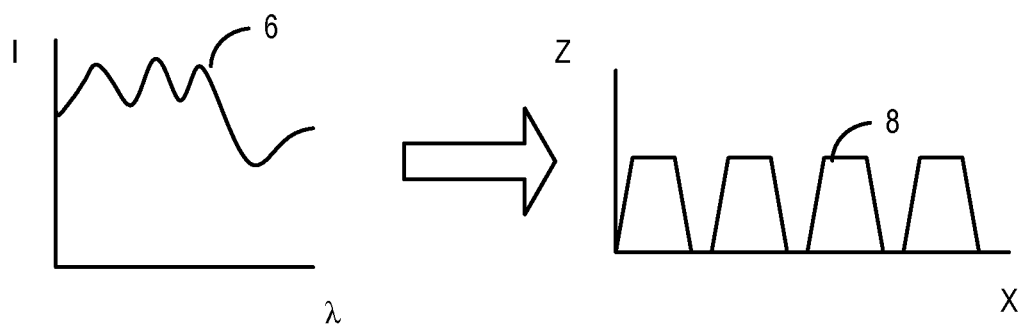

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety A metrology apparatus which employs a computational imaging/phase retrieval approach has been described in US patent publication US2019/0107781, which is incorporated herein by reference. Such a metrology device may use relatively simple sensor optics with unexceptional or even relatively mediocre aberration performance. As such, the sensor optics may be allowed to have aberrations, and therefore produce a relatively aberrated image. Of course, simply allowing larger aberrations within the sensor optics will have an unacceptable impact on the image quality unless something is done to compensate for the effect of these optical aberrations. Therefore, computational imaging techniques are used to compensate for the negative effect of relaxation on aberration performance within the sensor optics.

In such an approach, the intensity and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements. The phase retrieval itself may be based on that described in the aforementioned US2019/0107781, or in patent application EP17199764 (also incorporated herein by reference). This describes determining from an intensity measurement, a corresponding phase retrieval such that interaction of the target and the illumination radiation is described in terms of its electric field or complex field ("complex" here meaning that both amplitude and phase information is present). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field/complex field within the model so as to minimize the difference between the modelled intensity pattern and the detected intensity pattern. More specifically, during a measurement acquisition, an image (e.g., of a target) is captured on detector (at a detection plane) and its intensity measured. A phase retrieval algorithm is used to determine the amplitude and phase of the electric field at a plane for example parallel with the target (e.g., immediately above the target). The phase retrieval algorithm uses a forward model of the sensor (e.g. aberrations are taken into account), to computationally image the target to obtain modelled values for intensity and phase of the field at the detection plane. No target model is required. The difference between the modelled intensity values and detected intensity values is minimized in terms of phase and amplitude (e.g., iteratively) and the resultant corresponding modelled phase value is deemed to be the retrieved phase. Specific methods for using the complex field in metrology applications are described in PCT application PCT/EP2019/052658, also incorporated herein by reference.

Performing measurements sequentially at multiple focus levels takes significant time. Obtaining stepwise defocused images is therefore slow, resulting in a slow measurement speed and low throughput. Also, there are assumptions inherent in using focus diversity measurements which lead to inaccuracy in the phase retrieval, such as the assumption that moving the sample through focus is equivalent to moving the detector through focus. As such, the methods described herein obviate the need for such through focus diverse measurements.

The proposed methods and apparatuses comprise using at least one set of direction detecting pixels to detect the direction of light rays travelling towards the sensor. Using the information given by these direction detecting pixel sets, the phase distribution can be deduced and used to perform an image correction. Each direction detecting pixel set may comprise at least one direction detecting pair of pixels, with each set or pair of pixels being in the same vicinity as each other.

The one or more sets of direction detecting pixels may comprise a subset of the pixels on a detector used to detect an image. The remaining pixels (imaging pixels) are used to measure the image (e.g., intensity (and therefore amplitude) of the signal.

As such, it is proposed to infer the complex valued field at the detector. This complex field may be inferred from a combination of the signal measured by the imaging pixels, which is used to determine the field amplitude; and the signal from the direction detecting pixels, which is used to determine the field phase. An interpolation may need to be performed to obtain the full complex field, e.g., to interpolate over the missing amplitude data (at detector area occupied by direction detecting pixels) and to interpolate over the missing phase data (at detector area occupied by imaging pixels). This interpolation may be performed on the field amplitude data and field phase data prior to determining the complex field, or on the determined complex field to determine the full complex field.

The complex field can be Fourier transformed to get to the pupil plane. The lens aberration phase profile is conjugated and multiplied with the Fourier transformed complex field. The defocus aberration is then digitally adjusted so as to maximize image quality and correct for the sensor optics aberrations.

A plurality of sets of direction detecting pixels may be provided; e.g., at a number of (for example equally spaced) locations on the detector array. In an embodiment, these multiple sets of direction detecting pixels may comprise a 1-dimensional or 2-dimensional direction detecting array of pixel sets; where, for example, the direction detecting array comprises a sub-array of the detector pixel array generally. Optionally, where the sets of direction detecting pixels comprise a 1-dimensional arrays, a first subset of the sets may be oriented to detect direction with respect to a first axis of the detector plane and a second subset of the sets may be oriented to detect direction with respect to a second (perpendicular) axis of the detector plane.

Note that the terms "direction detecting pixels" and "imaging pixels" are used solely to distinguish one set of pixels from another. It is likely that both of these classes of pixels will be comprised on a single camera or pixel array and will therefore operate using the same basic detection principles (e.g., a photodiode or equivalent device which detects intensity levels). It is only how the signal is received by the pixels (e.g., whether via mask/microlens or not), and/or how the signal is processed, which distinguishes the two classes of pixels.

The working principle shares similarities with the concept of a PDAF (phase detect auto focus) pixel architecture which is used currently in many commercial consumer cameras. In the PDAF scheme, a number of pixel pairs distributed over the sensor area are used to detect whether the image is in focus or not. PDAF is made possible by the provision of "focus pixels", which are a small percentage of pixels on the main camera sensor grid that have been set aside for focusing instead of capturing the image. Focus pixels typically come in pairs. In each focus pixel pair, the pixels are near each other on the sensor, and partly masked such that one pixel only receives light from the top (or left) part of the lens, while the other pixel in the pair only receives light from the opposite part of the lens. Because the pair of pixels are in the same vicinity, they should receive the same amount of light when the image is in focus at that point. If they receive different amounts of light, the difference provides information on the level of image defocus. The camera can then use this information to quickly focus the lens. A typical PDAF system has many focus pixel pairs (or equivalent) spread around the sensor area, since the target object (being focused on) is not always in the same place on the lens.

An extension of this principle, for use in 3D imaging applications, is disclosed in "CMOS image sensor for extracting depth information using offset pixel aperture technique," Choi et al; Proc. SPIE 10376, Novel Optical Systems Design and Optimization XX, 103760Y (24 Aug. 2017). This document is incorporated herein by reference. In particular, this document (and in particular FIGS. 5 and 6, and the accompanying text of this document) describes how a partially masked pixel array can be used to measure the angle of incidence of incident radiation on the pixel array. More specifically, this document describes pixel sets of three masked pixels:

- A first pixel is masked using a left offset pixel aperture LOPA mask; i.e. a mask which has a light admitting aperture that is offset to the left of the photodiode.
- A second pixel is masked using a right offset pixel aperture ROPA mask; i.e. a mask which has a light admitting aperture that is offset to the left of the photodiode, and
- A third pixel which is masked by a non-offset or centered light admitting aperture.

A plot of optical power (or intensity) against angle of incidence for each of these masked pixels, shows that there is a distinct shift in the position of each peak (corresponding to a different angle of incidence) for the LOPA masked pixel, ROPA masked pixel and non-offset masked pixel. In the specific arrangement described in the document, the peak point of the LOPA masked pixel is shifted by 12° and that of the ROPA masked pixel is shifted by −12° from the peak point of the non-offset masked pixel. By comparing the intensity of light detected by these three (e.g., adjacent) pixels, the angle of incidence (light direction) can be classified into 12°, 0 or −12°. The intermediate angles can also be determined from the plot.

Figure 5B:
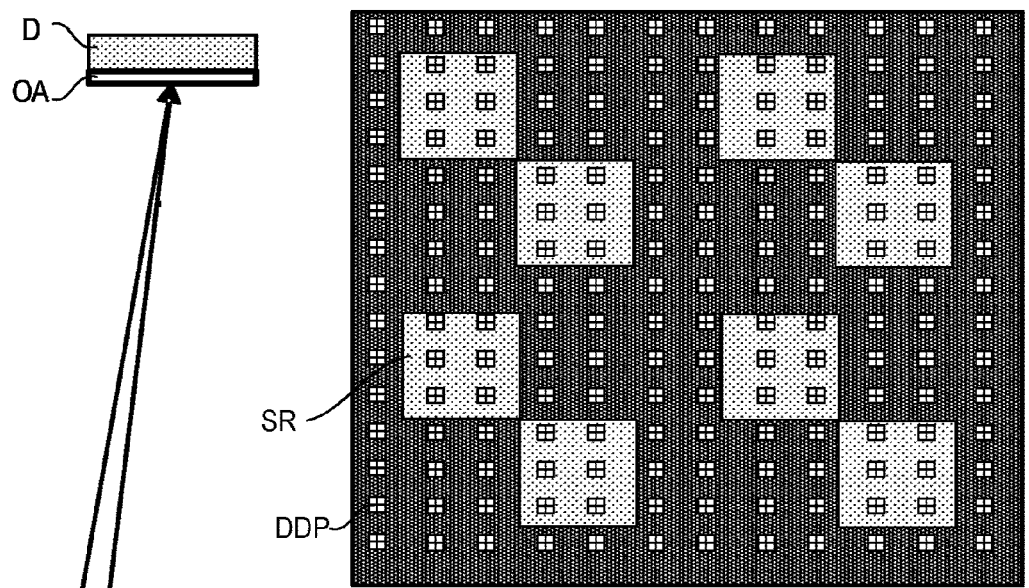
FIGS. 5A-5B illustrate a detection arrangement with direction detection according to an embodiment of the invention.
Figure 5A:
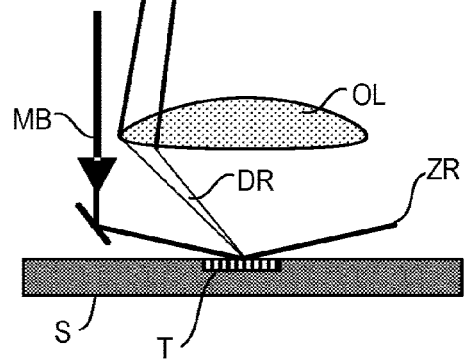

FIG. 5 illustrates a metrology arrangement according to an embodiment. The arrangement is largely similar to those described in the aforementioned documents US2019/0107781 and PCT/EP2019/05265, which makes use of computational phase retrieval techniques to correct for a simpler, aberrated lens design. In FIG. 5(*a*), the highly simplified schematic diagram shows a measurement beam MB of radiation (e.g., from a source, not shown) directed onto a target T on a substrate S. Higher order diffracted radiation DR is captured by objective lens OL and directed to a detector D. The zeroth order radiation ZR is not captured, and as such the captured image is a darkfield image.

Between the objective lens OL and detector D (e.g., immediately in front of detector D) is a masking array or obscuration array OA. The obscuration array OA comprises a plurality of mask sets or obscuration sets (note that the use of the term "mask" here is distinct from use of the same term to be synonymous with reticle- to avoid confusion, obscuration will be used instead). Each obscuration set comprises a plurality of partial obscurations which partially obscure a corresponding direction detecting pixel. Each partial obscuration of an obscuration set has a different obscuration direction, location or configuration (e.g., a different position or offset in the obscuration and/or aperture therein with respect to its corresponding pixel).

The detector D is a camera type detector having a plurality of pixels, e.g., a two-dimensional pixel matrix. The obscuration array is configured such that the obscuration sets are spaced apart and the majority of the pixel matrix is unobscured. These unobscured pixels are the imaging pixels. Each set of pixels obscured by an obscuration set is a direction detecting pixels set, each comprising a plurality of direction detecting pixels.

FIG. 5(*b*) illustrates an example image (or part thereof) as might be detected on a detector (e.g., when imaging a target of the "two bias per direction" diffraction based overlay type which are well known in the art). The captured images are signified by shaded regions SR, where a higher intensity value is detected relative to the rest of the detector (e.g., due to the diffracted radiation DR). These correspond to target pads or gratings oriented with the measurement illumination profile. A subset of the detector pixel array comprises the direction detecting pixel sets DDP, these being the pixels obscured by the obscuration array. The imaging pixels are not depicted individually, for clarity. Note that this is a purely exemplary arrangement, and the direction detecting pixels may comprise a different (e.g., smaller) proportion of the detector pixel array than the illustration suggests here, and/or may be arranged or spaced differently.

Each direction detecting pixel set may comprise, for example, a pair of pixels having a corresponding obscuration set with two different obscuration offsets; e.g., a left direction detecting pixel may have a left obscuration, obscuring the left portion of pixel detecting area and a right direction detecting pixel may have a right portion of the light detecting area obstructed by a right obscuration. A microlens array (e.g., a microlens array film) may be used in front of the direction detecting pixels in order to collect more light. More precise direction detection may be obtained by providing more direction detecting pixels per direction detecting pixel set.

In an embodiment, each direction detecting pixel set may comprise a two dimensional array of direction detecting pixels, to enable direction detection in the two directions of the detector plane. In such a two-dimensional arrangement, the offsets may also be two-dimensional: For example, a four (2×2) pixel array may have aperture offsets towards each corner or a nine (3×3) pixel array may have offsets respectively: top-left, top, top-right, right, bottom-right, bottom, bottom-left, left and center. The number of pixels per direction detecting pixel set will ultimately be a trade-off between the accuracy of direction/phase detection and the consequent loss in imaging area (imaging pixels). In some practical implementations, each direction detecting pixel set may comprise either a 3×3, 4×4 or 5×5 array of pixels. More specifically, assuming a magnification of Mag=100×, and a typical 5 µm pixel size, there will be 800×800 pixels used to sample the image of an 8 µm target on the wafer. This means an array may comprise four pixels up to a practical maximum of around 100×100 pixels for a direction detecting pixel set. A two dimensional array of direction detecting pixels need not necessarily square, particularly when there is a larger number of pixels per array.

Figure 6:
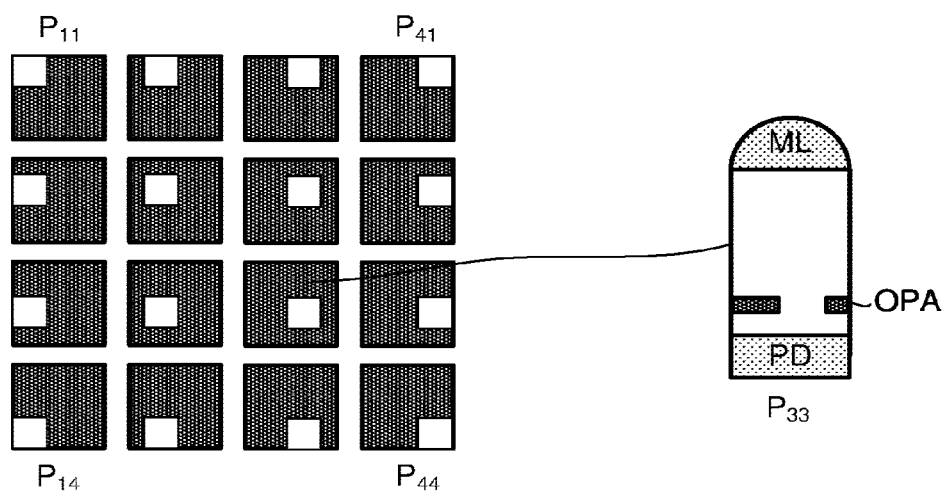
FIG. 6 illustrates a set of direction detection pixels according to an embodiment of the invention.

FIG. 6 shows an exemplary arrangement comprising a 4×4 array of direction detecting pixels in a direction detecting pixel set which can detect direction (and therefore phase) in two dimensions. The arrangement comprises 16 offset aperture obscured pixels $P_{11}$ to $P_{44}$ (the suffix describes the pixel's location in the array with only four $P_{11}$, $P_{41}$, $P_{14}$, $P_{44}$ explicitly labeled). As can be seen by the cross-section view of one of the pixels $P_{33}$, each pixel comprises a photodiode PD masked by an offset pixel aperture OPA. The offset of each offset pixel aperture OPA is different, such that the aperture is in a different location with respect to the photodiode for each pixel. In an embodiment (such as that shown), the offset and therefore aperture location may correspond with that pixel's location in the array. In other words, the direction of the offset and the magnitude of the offset corresponds with the pixel's location in the array.

Optionally, each pixel may also comprise a corresponding microlens ML, which helps gather more radiation into each direction detecting pixel (e.g., to compensate for the light lost to absorption and/or reflection by the mask).

The maximum angle of the light rays at the detector D in the metrology application considered here is typically 1 degree and the resolution of angle detection should be in the range of 0.1 degree. Therefore, the pixel size and focal distance should be chosen accordingly. By using larger pixels and increasing focal length of the microlens array, the direction sensitivity can be linearly enhanced.

It is proposed that an arrangement such as illustrated in FIGS. 5 and 6, and in particular the direction detecting pixel set, can be used to retrieve phase of the diffracted radiation DR at (or very close to) the detector plane.

The phase retrieval may comprise a first step of using the direction detecting pixel set to deduce the direction of incident radiation. This may comprise using the methods described in the aforementioned "CMOS image sensor for extracting depth information using offset pixel aperture technique" document; e.g., deducing the angle by which sensor in the array detects radiation, and/or by relative intensity levels measured by adjacent pixels.

Figure 7:
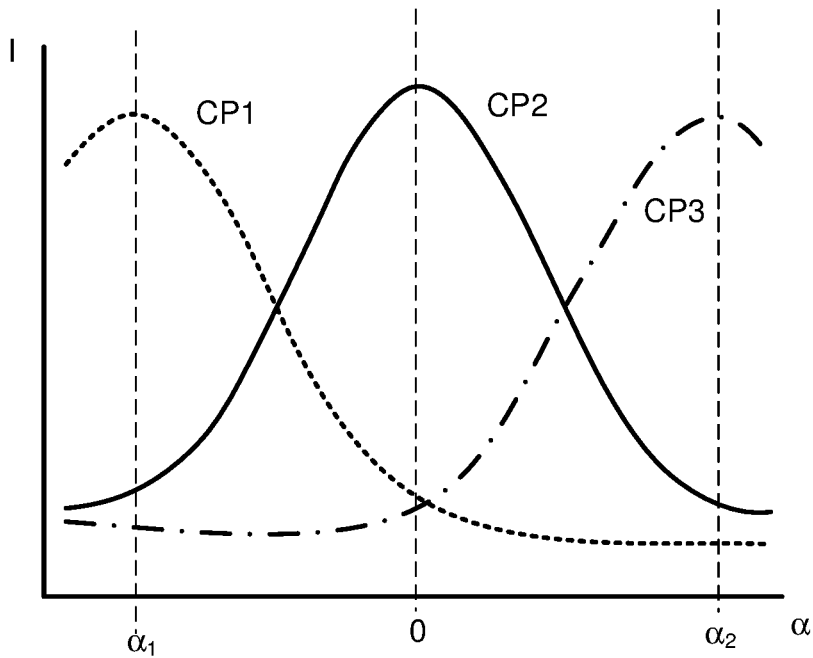
FIG. 7 is a plot of intensity against incident angle for the set of three adjacent direction detection pixels, illustrating how direction may be deduced from the sensed intensity values in a method according to an embodiment of the invention.

FIG. 7 is a graph of intensity or power I against direction or angle $\alpha$ (as incident on the detector) which helps explain a method for deducing direction using a direction detecting pixel set such as illustrated in FIG. 6. The figure shows three curves CP1, CP2, CP3, each corresponding respectively to three adjacent pixels (in a single direction) of a direction detecting pixel set. It can be seen that the curve CP2 for is centered on zero angle (normally incident) radiation, which may correspond with a center pixel (e.g., in a center column/row) of an odd numbered (e.g. 3×3 or 5×5) direction detecting pixel array, with curves CP1, CP3 corresponding to pixels either side, with peaks at angles $\alpha_1$ and $\alpha_2$. Consequently, angles 0 degrees, $\alpha_1$ and $\alpha_2$ can be readily distinguished by which of the corresponding pixels detects a peak intensity (or an intensity value over a threshold value). Intermediate angles can be deduced by the relative intensities sensed by the relevant adjacent pixels; e.g., an angle intermediate 0 and $\alpha_1$ can be deduced by the relative intensity levels on the pixels corresponding to CP1 and CP2 (e.g., the ratio of the intensity levels on these pixels). For example, equal (non-zero) intensity levels on each of these two pixels would indicate an angle corresponding to the crossing point of curve CP1 and curve CP2. How to extend this concept to more than three pixels, and to two dimensions, will be readily apparent to the skilled person.

The key information required to correct for aberrations in the image are the both the direction of the light rays determined by the direction detecting pixel sets and the intensity detected by the imaging pixels. A conventional image sensor can only detect the intensity of the light. In this concept, the main detector chip is provided with the sets of direction detection pixels, located sparsely over the detector area. Thus some of the real estate on the detector is used for detecting the direction of the rays. The remaining area is used to detect the image as is done conventionally. The area reserved for detecting direction will be smaller than the area for image detection (e.g., 5-20% of the total area is used for detecting direction).

It will be appreciated that some of the information on the intensity distribution is lost due to the direction detecting pixels and there will be empty gaps in the intensity image. The gaps can be filled via 2D interpolation. Similarly the direction information from the direction detecting pixels is also not complete, and is indeed measured rather sparsely. The full phase map can also be interpolated over the whole detector area, as the direction information in such an application is relatively smooth and slowly varying over the image area.

As such, once the angle and therefore direction of the diffracted radiation is detected at one or more direction detecting pixel set, an interpolation over whole image is performed to find the direction over the whole image. From this, a phase map can be deduced the image corrected for aberrations in the sensor. A similar intensity map can be obtained, and therefore a map of the full complex field from a combination of the phase map and an amplitude map (e.g., the latter being a square root of the intensity map). Using a description or model of the sensor optics and its aberrations (e.g., a lens aberration phase profile), the complex field can then be corrected for these aberrations to obtain an improved image; e.g., using the methods already described.

Figure 8:
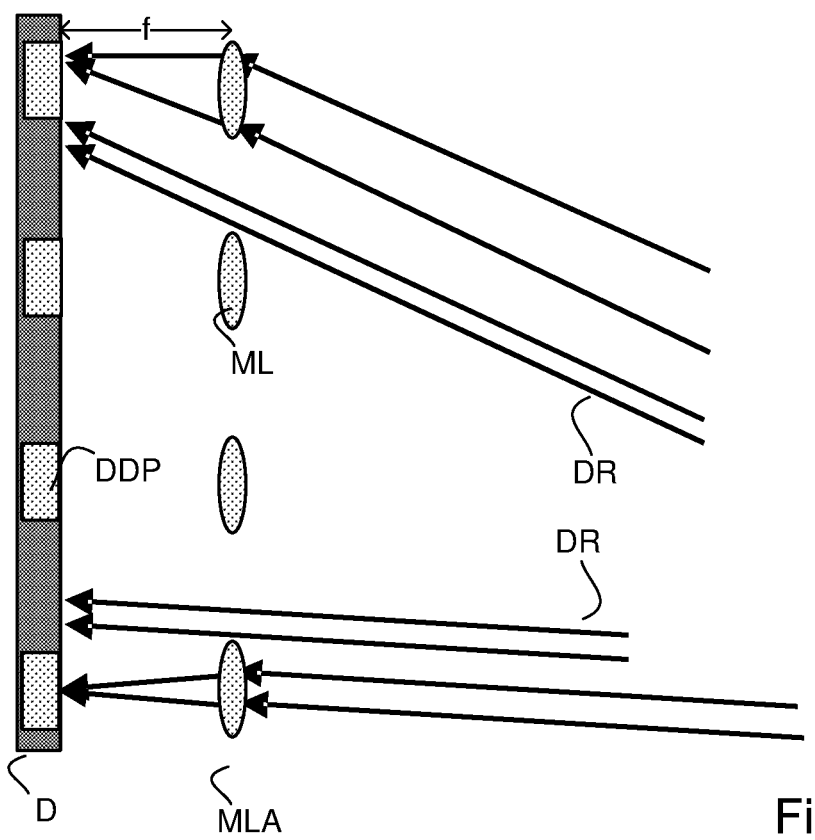
FIG. 8 illustrates a detection arrangement with direction detection according to a further embodiment of the invention.

FIG. 8 illustrates an alternative other arrangement for performing local direction detection. This method uses a sparse microlens array MLA comprising an array of microlenses ML. The microlens array is sparse in that the lenses are arranged at a relatively large separation with a low duty cycle (e.g., between 5 and 10%). The microlens array is placed at a distance f from the detector plane, where distance f comprises the focal length of the microlens array. The set of pixels which fall under each microlens array are dedicated to direction (phase) detection, e.g., a direction detecting pixel set. The remaining pixels are used as conventional imaging pixels.

The measurement principle of this embodiment differs from that described for the offset aperture masked pixels. Radiation falling on a microlens is focused onto an area of a detector (e.g., a direction detecting pixel set) into a bright spot. The location of the bright spot on the direction detecting pixel set (e.g., in two dimensions) reveals the radiation beam direction incident on the microlens. The microlens array is sparse which means there are large gaps between each microlens; as before the pixels (imaging pixels) comprised in these gaps measure intensity information conventionally.

The accuracy of the angle detection for this embodiment can be approximately estimated as follows. Assume that the microlens diameter d to be 100 µm, the focal length of the microlens f to be 1 mm, the pixel size PS of the sensor to be 5 µm, and the radiation wavelength $\lambda$ to be 500 nm. This means that the chief beam shifts by 1 pixel when the angle changes by PS/f=5 mrad. The diffraction limited spot size is =5 µm. The spot blurring due to finite lens diameter is also f*$\lambda$/d which is also 5 µm. Therefore, considering aberrations, a spot of approx. 10 µm-15 µm diameter can be formed by each lens (e.g., a compact isolated spot). The peak of this spot can be determined with an accuracy of 1-2 pixels which is sufficient for estimating the local phase (direction) with an accuracy of 10 mrad. Using sub-pixel interpolation of the location of the peak, it is possible to obtain an accuracy of 1 mrad. The accuracy is limited by the signal to noise ratio there should be a good signal strength in order to detect the peak of the spot accurately. The number of pixels in a direction detecting pixel set (or array) may be the same or similar as in the previous embodiment.

It can be appreciated that this microlens embodiment comprises an arrangement of a sparse lens array placed at a distance away from a conventional image detector. Therefore no special detector chip fabrication is required. By contrast, the first (offset aperture mask) embodiment is an on-chip solution, with the microlenses (if present) on the chip with shielded pixels to detect direction. This non-conventional image sensor requires special fabrication for this purpose.

After image acquisition, two images are created: a low resolution phase variation image from the direction detecting pixel sets and a conventional image from the imaging pixels. The low resolution phase variation image is extrapolated to create a high resolution phase map. This map may be used as an initial estimate in an iterative algorithm which corrects for aberrations of the images.

It has to be noted that this technique is not the same as of a plenoptic camera. In a plenoptic camera, a local pupil image is created under each microlens. The 2D collection of local pupil images is called 4D light field. In the proposal here, the microlenses based angle detection is done sparsely and such 4D light fields are not measured.

Figure 9:
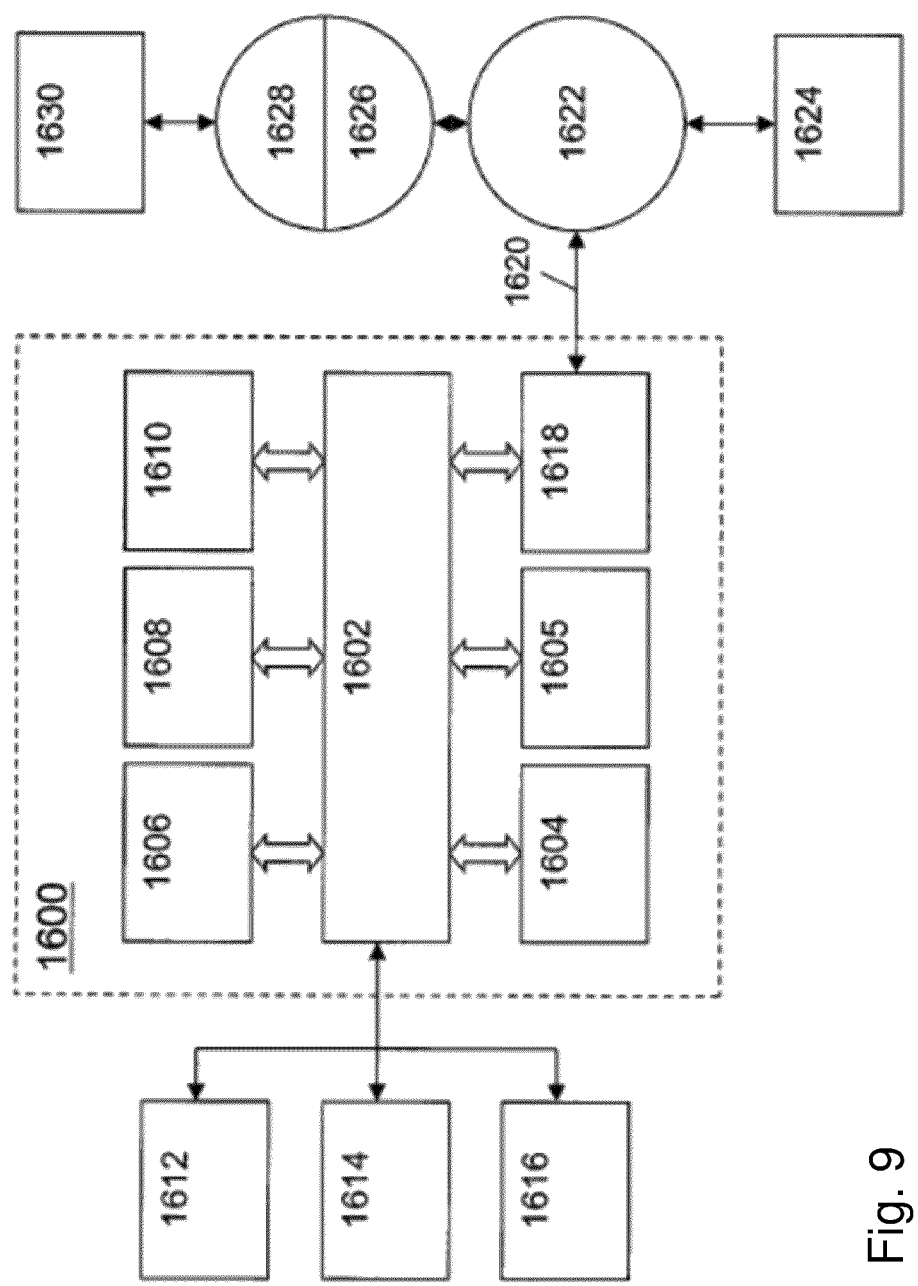
FIG. 9 is a block diagram illustrating a computer system which may assist in implementing methods according to embodiments of the invention.

FIG. 9 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are disclosed in the subsequent numbered clauses:

1. A detection apparatus for a metrology device operable to measure a parameter of interest from scattered radiation having been scattered from a sample; the detection device comprising:
a detector comprising an array of pixels, said array of pixels comprising imaging pixels for detecting an image from which the parameter of interest is determined, and direction detecting pixels for detecting the angle of incidence of said scattered radiation on said detector.
2. A detection apparatus as defined in clause 1, wherein said direction detecting pixels comprise multiple sets of direction detecting pixels spaced apart over the detector, each set of direction detecting pixels for detecting said angle of incidence local to that direction detecting pixel sets.
3. A detection apparatus as defined in clause 2, wherein said sets of direction detecting pixels are placed in a two dimensional grid.
4. A detection apparatus as defined clause 2 or 3, wherein each set of direction detecting pixels comprises a one-dimensional array of direction detecting pixels.
5. A detection apparatus as defined in clause 4, wherein said sets of direction detecting pixels comprise two subsets thereof, one subset oriented perpendicular to the other, for detecting direction in two dimensions of the detector plane.
6. A detection apparatus as defined in clause 2 or 3, wherein each set of direction detecting pixels comprises a two-dimensional array of direction detecting pixels for detecting direction in two dimensions of the detector plane.
7. A detection apparatus as defined in any of clauses 2 to 6, wherein each direction detecting pixel comprises a respective obscuration which partially obscures the pixel from the scattered radiation.
8. A detection apparatus as defined in clause 7, wherein a set of direction detecting pixels comprises direction detecting pixels having respective obscurations, each obscuration having an aperture to admit some incident radiation, wherein each aperture has a different offset or position with respect to its corresponding pixel.
9. A detection apparatus as defined in clause 8, wherein the offset or position of each aperture corresponds to the respective pixel's location within its set of direction detecting pixels.
10. A detection apparatus as defined in any of clauses 7 to 9, wherein each of the direction detecting pixels comprises a respective microlens before the obscuration.
11. A detection apparatus as defined in any of clauses 2 to 6, wherein each set of direction detecting pixels has a respective microlens located to focus said scattered radiation towards the set of direction detecting pixels.
12. A detection apparatus as defined in clause 11, wherein each microlens is located at a distance from its respective set of direction detecting pixels comprising the focal length of the microlens.
13. A detection apparatus as defined in clause 11 or 12, wherein the microlenses form an array of microlenses being sparsely separated with a duty cycle below 10%.
14. A detection apparatus as defined in any of clauses 7 to 10, wherein said detection apparatus comprises a processor operable to determine said angle of incidence of said scattered radiation from which one or more direction detecting pixels of a set of direction detecting pixels detects an intensity value over a threshold value.
15. A detection apparatus as defined in clause 14, wherein the processor is operable to determine the angle of incidence of said scattered radiation from relative intensity levels detected on at least two respective direction detecting pixels of a set of direction detecting pixels.
16. A detection apparatus as defined in any of clauses 11 to 13 wherein said detection apparatus comprises a processor operable to determine said angle of incidence of said scattered radiation from the location of a spot focused by the microlens on the set of direction detecting pixels.
17. A detection apparatus as defined in any of clauses 14 to 16, wherein the processor is operable to perform an interpolation to interpolate the angle of incidence, or phase value determined therefrom, over an image captured by the detector based on the local angle of incidence determinations from each of said sets of direction detecting pixels; and
use the result of the interpolation step to determine a phase map describing the phase of the scattered radiation at the detector.
18. A detection apparatus as defined in clause 17, wherein the processor is operable to use the phase map and image data captured by the imaging pixels to determine the complex-valued field of the scattered radiation at the detector.
19. A detection apparatus as defined in clause 18, wherein the detection apparatus comprises sensor optics for capturing the scattered radiation; and
the processor is operable to use the complex-valued field to correct for aberrations in the sensor optics.
20. A metrology device comprising the detection apparatus of any preceding clause.
21. A lithographic cell comprising:
the metrology device of clause 20, to perform measurements from which corrections are determined for a lithographic process; and
a lithographic apparatus operable to perform the lithographic process in accordance with said corrections.
22. A lithographic apparatus comprising a metrology module, the metrology module comprising the detection apparatus of any of clauses 1 to 19.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A detection apparatus comprising:
   a detector comprising an array of pixels, the array of pixels comprising:
      imaging pixels configured to detect an image from which a parameter of interest from scattered radiation having scattered from a sample is determined, and
      direction detecting pixels for detecting an angle of incidence of the scattered radiation on the detector, wherein:
   each direction detecting pixel comprises a respective obscuration that partially obscures the pixel from the scattered radiation.

2. The detection apparatus of claim 1, wherein the direction detecting pixels comprise multiple sets of direction detecting pixels spaced apart over the detector, each set of the direction detecting pixels configured to detect the angle of incidence local to that direction detecting pixel set.

3. The detection apparatus of claim 2, wherein the sets of direction detecting pixels are placed in a two dimensional grid.

4. The detection apparatus of claim 2, wherein:
   each set of the direction detecting pixels comprises a one-dimensional array of direction detecting pixels, and
   the sets of the direction detecting pixels comprise two subsets thereof, one subset oriented perpendicular to the other, configured to detect direction in two dimensions of the detector plane.

5. The detection apparatus of claim 2, wherein each set of direction detecting pixels comprises a two-dimensional array of direction detecting pixels for detecting direction in two dimensions of the detector plane.

6. A detection apparatus comprising:
   a detector comprising an array of pixels, the array of pixels comprising:
      imaging pixels configured to detect an image from which a parameter of interest from scattered radiation having scattered from a sample is determined, and
      direction detecting pixels for detecting an angle of incidence of the scattered radiation on the detector, wherein:
   the direction detecting pixels comprise multiple sets of direction detecting pixels spaced apart over the detector, each set of the direction detecting pixels configured to detect the angle of incidence local to that direction detecting pixel set;
   each of the direction detecting pixels comprises a respective obscuration that partially obscures the pixel from the scattered radiation;
   a set of the direction detecting pixels comprises direction detecting pixels having respective obscurations, each obscuration having an aperture to admit some incident radiation, wherein each aperture has a different offset or position with respect to its corresponding pixel; and
   the offset or position of each aperture corresponds to the respective pixel's location within its set of direction detecting pixels.

7. The detection apparatus of claim 6, wherein each of the direction detecting pixels comprises a respective microlens before the obscuration.

8. A detection apparatus comprising:
   a detector comprising an array of pixels, the array of pixels comprising:
      imaging pixels configured to detect an image from which a parameter of interest from scattered radiation having scattered from a sample is determined, and direction detecting pixels for detecting an angle of incidence of the scattered radiation on the detector, wherein:

the direction detecting pixels comprise multiple sets of direction detecting pixels spaced apart over the detector, each set of the direction detecting pixels configured to detect the angle of incidence local to that direction detecting pixel set, and each set of the direction detecting pixels has a respective microlens located to focus the scattered radiation towards the set of the direction detecting pixels.

9. The detection apparatus of claim 8, wherein each microlens is located at a distance from its respective set of the direction detecting pixels comprising a focal length of the microlens.

10. The detection apparatus of claim 8, wherein the microlenses form an array of microlenses being sparsely separated with a duty cycle below 10%.

11. The detection apparatus of claim 6, wherein:

the detection apparatus comprises a processor operable to determine an angle of incidence of the scattered radiation from which one or more of the direction detecting pixels of a set of the direction detecting pixels detects an intensity value over a threshold value, and the processor is operable to determine the angle of incidence of the scattered radiation from relative intensity levels detected on at least two respective direction detecting pixels of a set of direction detecting pixels.

12. The detection apparatus of claim 8, wherein the detection apparatus comprises a processor operable to determine the angle of incidence of the scattered radiation from the location of a spot focused by the microlens on the set of direction detecting pixels.

13. The detection apparatus of claim 11, wherein:

the processor is operable to perform an interpolation to interpolate an angle of incidence, or phase value determined therefrom, over an image captured by the detector based on local angle of incidence determinations from each of the sets of direction detecting pixels and use the result of the interpolation to determine a phase map describing a phase of the scattered radiation at the detector, the processor is operable to use the phase map and image data captured by the imaging pixels to determine a complex-valued field of the scattered radiation at the detector, the detection apparatus comprises sensor optics for capturing the scattered radiation, and the processor is operable to use the complex-valued field to correct for aberrations in the sensor optics.

14. A metrology device comprising the detection apparatus of claim 1.

15. A lithographic cell comprising:

the metrology device of claim 14, to perform measurements from which corrections are determined for a lithographic process; and a lithographic apparatus operable to perform the lithographic process in accordance with the corrections.

* * * * *